United States Patent
Avanzino et al.

(10) Patent No.: US 6,756,306 B2
(45) Date of Patent: Jun. 29, 2004

(54) LOW TEMPERATURE DIELECTRIC DEPOSITION TO IMPROVE COPPER ELECTROMIGRATION PERFORMANCE

(75) Inventors: Steven C. Avanzino, Cupertino, CA (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/334,387

(22) Filed: Dec. 30, 2002

(65) Prior Publication Data

US 2004/0023511 A1 Feb. 5, 2004

Related U.S. Application Data (60) Provisional application No. 60/400,281, filed on Jul. 31, 2002.

(51) Int. Cl.[7] ................................................. H01L 21/44
(52) U.S. Cl. ........................ 438/687; 438/627; 438/643; 438/660; 438/761
(58) Field of Search ................................. 438/687, 622, 438/625, 626, 627, 631, 637, 672, 675, 660, 643, 761, 902, 976

(56) References Cited

U.S. PATENT DOCUMENTS

| | | | | |
|---|---|---|---|---|
| 6,319,819 B1 | * | 11/2001 | Besser et al. | 438/633 |
| 6,350,687 B1 | * | 2/2002 | Avanzino et al. | 438/687 |
| 6,432,822 B1 | * | 8/2002 | Ngo et al. | 438/687 |
| 6,465,361 B1 | * | 10/2002 | You et al. | 438/706 |

* cited by examiner

*Primary Examiner*—Kevin M. Picardat
(74) *Attorney, Agent, or Firm*—Foley & Lardner LLP

(57) ABSTRACT

The reliability and electromigration life-time of planarized metallization features, e.g., copper, inlaid in the surface of a layer of dielectric material, are enhanced by a chemical vapor deposition process for depositing a passivation layer over the metallization patterns which comprises maintaining on the upper surfaces of the metallization features, at or below a first temperature, an inhibiting film previously deposited thereon. The inhibiting film substantially inhibits oxide layer formation on the surface of the metallization features below the first temperature. Passivation layer deposition occurs at a second temperature higher than the first temperature such that the time interval between removal of the inhibiting film and formation of the passivation layer is short enough to substantially inhibit the formation of oxides on the surface of the metal feature.

20 Claims, 6 Drawing Sheets

FIG. 1A

FIG. 1B
ELECTROPLATE Cu

FIG. 1C
CMP

LOW TEMPERATURE DIELECTRIC DEPOSITION TO IMPROVE COPPER ELECTROMIGRATION PERFORMANCE

RELATED APPLICATIONS

This application claims priority under 35 U.S.C. §119(e) from U.S. Provisional Patent Application Serial No. 60/400,281, filed Jul. 31, 2002.

BACKGROUND OF THE INVENTION

1. Field of the Invention

The present invention relates to electrical devices, e.g., semiconductor integrated circuit devices, having inlaid ("damascene"-type) metallization patterns, e.g., interconnection lines, etc., and to a method for minimizing, or substantially preventing, deleterious electromigration of the metallic element(s) of the metallization pattern. More specifically, the present invention relates to semiconductor devices comprising copper (Cu) interconnection patterns and is applicable to manufacture of high speed integrated circuits having sub-micron dimensioned design features and high electrical conductivity interconnect structures.

2. Description of Related Art

The escalating requirements for high density and performance associated with ultra-large scale integration (ULSI) semiconductor device wiring are difficult to satisfy in terms of providing sub-micron-sized (e.g., 0.18 $\mu$m and under), low resistance-capacitance (RC) time constant metallization patterns, particularly wherein the sub-micron-sized metallization features, such as vias, contact areas, lines, etc. require grooves, trenches, and other shaped openings or recesses having very high aspect (i.e., depth-to-width) ratios due to microminiaturization.

Semiconductor devices of the type contemplated herein typically comprise a semiconductor wafer substrate, usually of doped monocrystalline silicon (Si) or, in some instances, gallium arsenide (GaAs), and a plurality of sequentially formed interlayer dielectrics and electrically conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced-apart metallization layers or strata are electrically interconnected by a vertically oriented conductive plug filling a via hole formed in the inter-layer dielectric layer separating the layers or strata, while another conductive plug filling a contact area hole establishes electrical contact with an active device region, such as a source/drain region of a transistor, formed in or on the semiconductor substrate. Conductive lines formed in groove- or trench-like openings in overlying inter-layer dielectrics extend substantially parallel to the semiconductor substrate. Semiconductor devices of such type fabricated according to current technology may comprise five or more layers or strata of such metallization in order to satisfy device geometry and microminiaturization requirements.

Electrically conductive films or layers of the type contemplated for use in e.g., "back-end" semiconductor manufacturing technology for fabricating devices having multi-level metallization patterns such as described supra, typically comprise a metal such as titanium (Ti), tantalum (Ta), tungsten (W), aluminum (Al), chromium (Cr), nickel (Ni), cobalt (Co), silver (Ag), gold (Au), copper (Cu) and their alloys. In use, each of the enumerated metals presents advantages as well as problems. For example, Al is relatively inexpensive, exhibits low resistivity, and is relatively easy to etch. However, in addition to being difficult to deposit by lower cost, lower temperature, more rapid "wet" type technology such as electrodeposition, step coverage with Al is poor when the metallization features are scaled down to sub-micron size, resulting in decreased reliability of interconnections, high current densities at certain locations, and increased electromigration. In addition, certain low dielectric constant materials, e.g., polyimides, when employed as dielectric inter-layers, create moisture/bias reliability problems when in contact with Al.

Cu and Cu-based alloys are particularly attractive for use in large scale integration (LSI), very large-scale integration (VLSI), and ultra-large scale (ULSI) semiconductor devices requiring multi-level metallization systems for back-end processing of the semiconductor wafers on which the devices are based. Cu- and Cu alloy-based metallization systems have very low resistivities, i.e., significantly lower than that of W and even lower than those of previously preferred systems utilizing Al and its alloys, as well as a higher (but not complete) resistance to electromigration. Moreover, Cu and its alloys enjoy a considerable cost advantage over a number of the above-enumerated metals, notably Ag and Au. Also, in contrast to Al and the refractory-type metals (e.g., Ti, Ta, and W), Cu and its alloys can be readily deposited at low temperatures in good quality, bright layer form by well-known "wet" plating such as electroless and electroplating techniques, at deposition rates fully compatible with the requirements of device manufacturing throughput.

As indicated above, a commonly employed method for forming inlaid metallization patterns as are required for back-end metallization processing of semiconductor wafers employs damascene-type technology. Generally, in such processing methodology, a recess (i.e., an opening for forming, e.g., a via hole, in a dielectric layer for electrically connecting vertically separated metallization layers, or a groove or trench for a metallization line) is created in the dielectric layer by conventional photolithographic and etching techniques, and filled with a selected metal. Any excess metal overfilling the recess and/or extending over the surface of the dielectric layer is then removed by, e.g., chemical-mechanical polishing (CMP), wherein a moving pad is biased against the surface to be polished/planarized, with the interposition of a slurry containing abrasive particles (and other ingredients) therebetween.

A variant of the above-described technique, termed "dual damascene" processing, involves the formation of an opening comprising a lower contact or via hole section in communication with an upper groove or trench section, which opening is filled with a conductive material, typically a metal, to simultaneously form a conductive via plug in electrical contact with a conductive line.

Referring now to FIGS. 1A–1H, schematically shown therein in simplified cross-sectional view, is a conventional damascene-type processing sequence employing relatively low cost, high manufacturing throughput plating and CMP techniques for forming recessed back-end metallization patterns (illustratively of Cu-based metallurgy but not limited thereto) in a semiconductor device formed in or on a semiconductor wafer substrate 1.

Figure 1A:
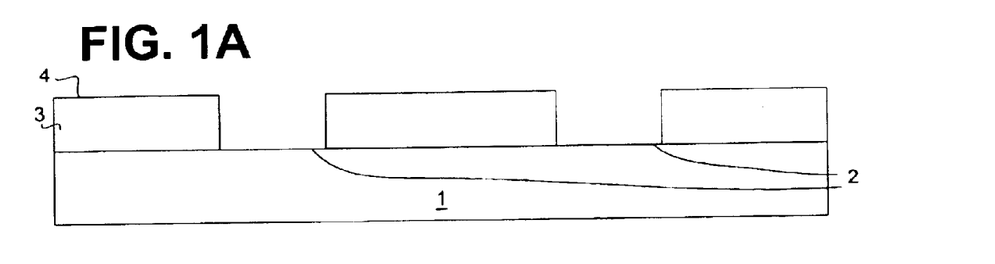
FIGS. 1A, 1B, 1C, 1D, 1E, 1F, 1G, and 1H illustrate, in simplified, cross-sectional schematic form, a process for forming a pattern of damascene-type, inlaid Cu metallization features according to conventional practices for manufacture of semiconductor integrated circuit devices.

As shown in FIG. 1A, the desired arrangement of conductors is defined as a pattern of recesses 2 such as via holes, grooves, trenches, etc. formed (as by conventional photolithographic and etching techniques) in the surface 4 of a dielectric layer 3 (e.g., a silicon oxide and/or nitride or an organic polymeric material) deposited or otherwise formed over the semiconductor substrate 1.

Figure 1B:
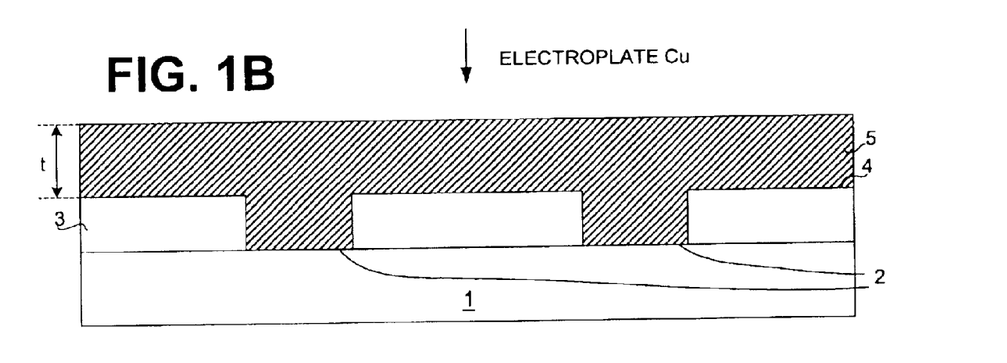

Then, as shown in FIG. 1B, a layer of conductive metal 5, for example, Cu or Cu-based alloy, is deposited by conventional plating techniques, e.g., electroless or electroplating techniques, to fill the recesses 2. In order to ensure complete filling of the recesses, the conductive metal 5 is deposited as a blanket (or "overburden") layer of excess thickness so as to overfill the recesses 2 and cover the upper surface 4 of the dielectric layer 3.

Before the step shown in FIG. 1B, an additional step may be performed of depositing an adhesion and/or diffusion barrier layer (not shown in FIGS. 1A through 1H) intermediate the semiconductor substrate 1 and the subsequently deposited layer of conductive metal 5 to prevent diffusion of the metal into adjacent structures, for example, semiconductor substrate 1 (typically Si) or dielectric layer 3, resulting in degradation of semiconductive or insulative properties, as well as poor adhesion of the deposited conductive metal 5 to various materials employed as dielectric inter-layers, etc. Suitable materials for such adhesion/barrier layers include, e.g., Ti, W, Cr, Ta, and tantalum nitride (TaN).

Figure 1C:
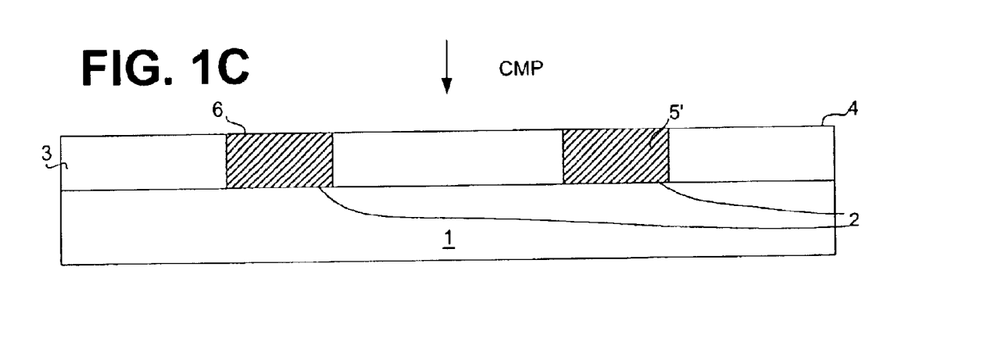

Next, as shown in FIG. 1C, the entire excess thickness t of the overburden layer of conductive metal 5 over the surface of the dielectric layer 3 is removed by a CMP process utilizing, for example, an alumina ($Al2O3$)-based slurry, leaving metal portions 5 in the recesses 2 with their exposed upper surfaces 6 substantially co-planar with the surface 4 of the dielectric layer 3.

When metal portions 5' comprise Cu or Cu-based alloys, Cu oxide(s), e.g., $Cu_2O$, CuO, $CuO_2$, etc., may form on the planarized Cu or Cu-based alloy surfaces of the inlaid metallization features due to the strong chemical oxidizing agents conventionally included in CMP slurries for enhancing Cu dissolution/removal rates and/or as a result of exposure of the freshly abraded Cu-based surfaces to an oxidizing atmosphere, e.g., air or oxygen. The thickness of the Cu oxide layer can vary depending upon the particular CMP processing conditions, e.g., stronger oxidizing agents contained in the CMP slurry result in thicker oxide layers, as does increased duration of exposure of freshly abraded, post CMP Cu surfaces to oxidizing atmospheres, e.g., air.

Cu oxide-containing layer(s), when formed as described above, disadvantageously increase contact resistance and reduce or prevent adhesion of layers thereto, for example silicon nitride-based passivation layers. Moreover, the Cu oxide layers are brittle, increasing the likelihood of circuit disconnect or reduced conductivity due to separation, as by peeling, of the Cu oxide layer from conductor layers in contact therewith. Yet another disadvantage attributable to the presence of Cu oxide at the interface between adjacent electrical conductors results from the rapid diffusion of Cu atoms and/or ions along the oxide layer. The latter characteristic of Cu oxide layers disadvantageously results in enhanced material transport during electrical current flow and thus increases the electromigration of Cu atoms and/or ions along Cu-based conductor lines.

Electromigration occurs in extended runs or lengths of metal conductor lines carrying significant currents. According to a conventional theory for explaining the mechanism of electromigration, the current flow within the conductor line can be sufficient to result in movement of Cu atoms and/or ions along the line via momentum transfer engendered by collision of the Cu atoms and/or ions with energetic, flowing electrons. The current flow also creates a thermal gradient along the conductor length which increases the mobility of the metal ions and/or atoms. As a consequence of the momentum transfer and the thermally enhanced mobility, metal (Cu) ions and/or atoms diffuse in the direction of the gradient, and metal (Cu) loss at the source end of the conductor eventually results in thinning of the conductor line. The electromigration effect can continue until the conductor line becomes so thin that it separates from the current input or forms an open circuit, resulting in circuit (i.e., semiconductor chip) failure. As this usually occurs over an extended period of operation, the failure is often seen by the end-user.

Thus, there exists a need for metallization process methodology which avoids the above-mentioned problems associated with oxide (particularly Cu oxide) formation on the metal surface, electromigration, and increased defect density, and which enables formation of metallization members, for example interconnect and routing lines (particularly of Cu or Cu-based alloys) having high reliability, high product yield, improved electromigration resistance, and high performance. In particular, there exists a need for eliminating the problems associated with electromigration and oxide layer formation resulting from CMP processing to form "inlaid", "damascene"-type Cu-based metallization patterns. Moreover, there exists a need for improved metallization processing technology which is fully compatible with conventional process flow, methodology, and throughput requirements in the manufacture of integrated circuit semiconductor devices and other devices requiring "inlaid" metallization patterns.

SUMMARY OF THE DISCLOSURE

Embodiments of the invention pertain to a method of manufacturing an electrical or electronic device having highly reliable, electromigration-resistant metallization patterns.

Additional embodiments of the invention pertain to a method of manufacturing a semiconductor integrated circuit device having highly reliable, electromigration-resistant Cu-based metallization patterns.

Yet other embodiments of the invention pertain to a method of manufacturing "inlaid", damascene-type Cu-based metallization patterns having improved reliability, high conductivity, and improved electromigration performance.

In accordance with preferred embodiments, a method is disclosed for passivating at least one metal feature in the upper, exposed surface of a layer of dielectric material overlying at least a portion of a substrate. An oxide inhibiting film is formed in contact with a surface of the metal feature. The inhibiting film is then removed at a first temperature. A passivation layer is formed in contact with the surface of the metal feature at a second temperature higher than the first temperature such that the time interval between removal of the inhibiting film and formation of the passivation layer is short enough to substantially inhibit the formation of oxides on the surface of the metal feature.

In a preferred embodiment of the invention, the passivation layer may comprise a material that is formed on the surface of the metal feature at a lower temperature than conventional silicon nitride deposition, which typically occurs at temperatures greater than 400 degrees C. The passivation layer material may be selected from the group including, but not limited to, silicon carbide and SiCN. Alternatively silicon nitride may be desposited at a lower temperature such as less than 400 degrees C. The inhibiting film may be formed using precursors selected from the group including, but not limited to, benzotriazole (BTA), tolyltriazole (TTA), BTA carboxylic acids (BTA-COOH), cystine, haloacetic acids, glucose, dodecyl mercaptan, 1,2, 4-triazole, imidazole, benzimidazole, and tetrazole.

In another preferred embodiment of the invention, the passivation layer may comprise silicon nitride and the inhibiting film may comprise a material that is removed upon reaching a higher first temperature. Thus, there is a time interval before reaching the second temperature short enough to substantially inhibit the formation of oxides on the surface of the metal feature. In this embodiment, the inhibiting film material may comprise $O-Cu-N(R)_x$ or $(R)_xN-Cu-N(R)_x$.

In yet another preferred embodiment of the invention, the passivation layer may comprise silicon nitride. However, the silicon nitride passivation layer is formed at a lower second temperature than is conventionally used for silicon nitride passivation layer formation. Thus, the inhibiting film is removed at the first temperature and the silicon nitride passivation layer is removed at the lower second temperature such that a time interval before reaching the lower second temperature is short enough to substantially inhibit the formation of oxides on the surface of the metal feature.

In preferred embodiments of the invention, the substrate may comprise a semiconductor wafer of monocrystalline silicon (Si) or gallium arsenide (GaAs) having a major surface, with the dielectric layer being formed over at least a portion of the major surface, and the at least one metal feature may comprise a plurality of unalloyed Cu damascene-type, inlaid features for providing vias, inter-level metallization, and/or interconnection lines of at least one active device region or component formed on or within said semiconductor wafer.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the invention.

Figure 1D:
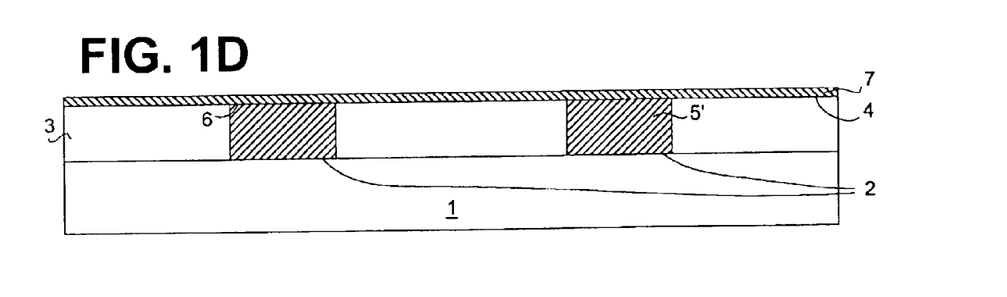

As described above with reference to FIG. 1C, according to conventional practices for manufacture of semiconductor integrated circuit devices, the entire excess thickness t of the overburden layer of conductive metal 5 over the surface of the dielectric layer 3 is removed by a CMP process. FIG. 1D shows the device of FIG. 1C after a CMP process. The CMP slurry typically comprises an inhibiting agent. The inhibiting agent may be left on the surface, after CMP, as a thin inhibiting film 7 (shown in FIG. 1D) and may help to protect metal portions 5' from an oxidizing atmosphere during subsequent stages of the semiconductor fabrication process. Effective inhibiting agents for Cu and Cu alloys may be formed from precursors such as benzotriazole (BTA), tolyl-triazole (TTA), BTA carboxylic acids (BTA-COOH), cystine, haloacetic acids, glucose, dodecyl mercaptan, 1,2, 4-triazole, imidazole, benzimidazole, and tetrazole.

Typically, subsequent to the CMP process, a passivation layer is deposited, for example, by a chemical vapor deposition (CVD) process, to further protect the metallization features of the device from an oxidizing atmosphere. A problem has been discovered to exist, however, in that during a post-CMP CVD process for depositing a passivation layer, temperatures within the CVD deposition chamber may be high enough to remove the inhibiting film from the surface a significant interval of time before the deposition temperature for the passivation layer is reached, thus increasing the amount of time that the metallization features of the device may be exposed to an oxidizing atmosphere. This problem is illustrated in FIGS. 1E through 1H.

Figure 1E:
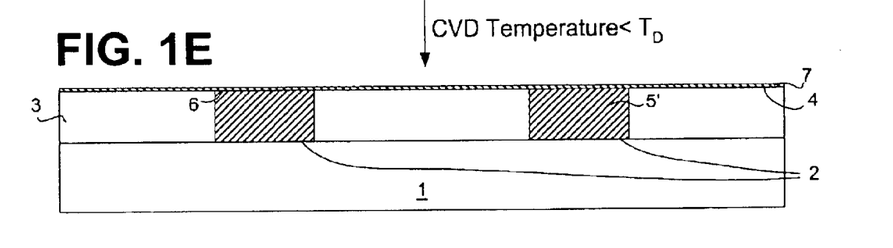
Figure 1F:
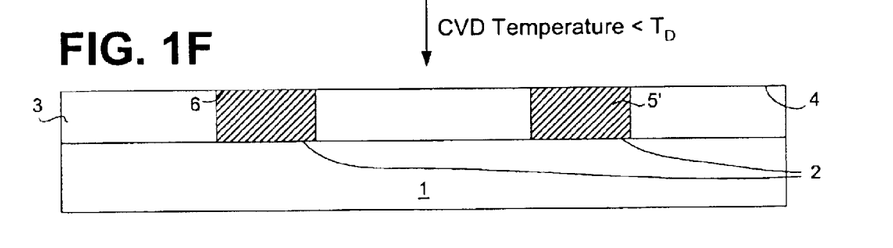

FIG. 1E shows the device of FIG. 1D at the beginning of a CVD process for depositing a passivation layer over the device. As the temperature in the deposition chamber increases towards the deposition temperature ($T_D$), the inhibiting film 7 is removed, as shown in FIG. 1F. Thus, the surface of the device is left unprotected as the temperature in the deposition chamber continues to increase towards the deposition temperature ($T_D$). As an example, a conventional $T_D$ for CVD deposition of a passivation layer comprising silicon nitride may be between about 600–800 degrees C. A plasma enhanced chemical vapor deposition (PECVD) process allows use of a lower $T_D$ of about 400 degrees C. for deposition of silicon nitride. Any inhibiting film on the surface may be disadvantageously removed at a time well before this $T_D$ is reached within the deposition chamber, thus exposing the metallization features of the device to an oxidizing atmosphere for longer intervals of time.

Figure 1G:
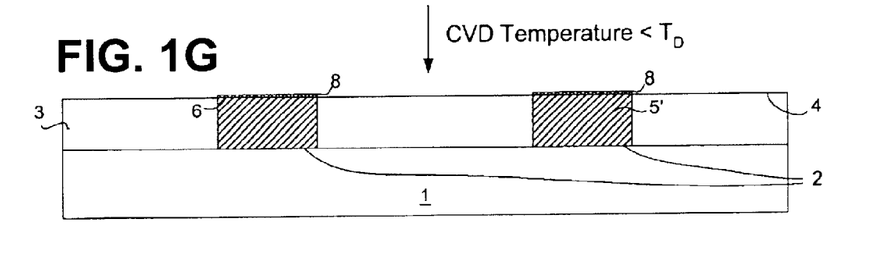

As the temperature in the deposition chamber increases towards the $T_D$, oxide layers 8 (for example, Cu oxide layers) form on the exposed surfaces of metal portions 5', as shown in FIG. 1G. Thus, during the passivation layer deposition process, the inhibiting film 7 (for example, BTA)

may be removed from the surface of the device a significant amount of time before the deposition chamber has reached a sufficient temperature for deposition of the passivation layer, exposing the surface of the device to oxygen containing ambients which may react with the metal portions 5' to form oxide layers 8.

Figure 1H:
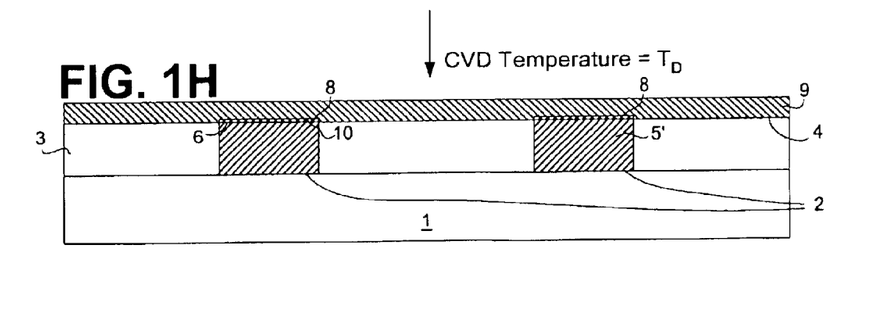

When the temperature within the deposition chamber reaches $T_D$, the passivation layer 9 is deposited over the surface of the device, including upper surfaces 10 and 4, respectively, of the oxide layers 8 and the dielectric layer 3. The oxide layers 8 disadvantageously increase contact resistance and reduce or prevent adhesion of passivation layer 9 to the surfaces 6 of the metal portions 5'. As a result of the reduced adhesion of passivation layer 9 to the metal portions 5', rapid diffusion of atoms and/or ions from metal portions 5' along the oxide layers 8 may occur. Thus, the oxide layers 8 may disadvantageously result in enhanced material transport during electrical current flow and thus may decrease the electromigration life-time of the metal portions 5'.

The present invention addresses problems arising from manufacturing electrical devices comprising inlaid metallization patterns, e.g., semiconductor integrated circuit devices, wherein, as part of the fabrication methodology, a plurality of recesses formed in the surface of a dielectric layer overlying a semiconductor substrate comprising at least one active device region or component are filled with a metal, illustratively Cu, which is subject to electromigration when the device is in use. More specifically, the present invention enables the formation of inlaid metallization patterns, e.g., of Cu-based metallurgy, in which the tendency for electromigration of the principal metallic element or component is minimized or substantially prevented. The present invention further enables the formation of inlaid metallization patterns which provide low contact resistance and good adhesion of layers thereto, e.g., passivation layers.

Preferred embodiments of the present invention provide a method of passivating metallization features (for example, Cu metallization features) in the upper, exposed surface of a layer of dielectric material overlying at least a portion of a substrate which substantially inhibits the oxide formation (for example, Cu oxides such as $Cu_2O$, $CuO$, and/or $CuO_2$) on the surface of the metallization features during a passivation layer deposition process (for example, a CVD passivation layer deposition process).

Briefly stated, according to preferred embodiments of the present invention, conventional damascene-type methodology (such as illustrated in FIGS. 1A through 1D) is employed for forming an inlaid metallization patterns in a dielectric layer overlying a suitable substrate, e.g., a semiconductor wafer comprising at least one active device region or component, by which processing an unalloyed metal, e.g., Cu, is utilized for filling the pattern of recesses in the dielectric layer.

In a preferred embodiment of the present invention, the passivation layer is deposited at a lower temperature than in the conventional damascene-type methodology. The reduced deposition temperature may be reached a shorter time interval after an inhibiting film left behind after the CMP process (as shown in FIG. 1D) is removed from the surface of the device. As a result, formation of oxides on the metallization features before the passivation layer can be deposited is advantageously reduced. The material for the passivation layer is chosen such that the deposition temperature for the passivation layer is reached a shorter time interval after the inhibiting film has been removed from the surface of the device than in the conventional damascene-type methodology. In one embodiment, a material having a lower deposition temperature than the conventional deposition temperature of silicon nitride is used as the passivation layer. Examples of such materials include silicon carbind, silicon nitride and SiCN. By utilizing such a material for the passivation layer, oxide formation on the surface of the metallization features during a passivation layer deposition process may be advantageously reduced by reducing the time the surface of the metal feature remains unprotected against oxide formation.

In another embodiment, an inhibiting film that persists on the surface of the device at higher temperatures may be employed in the CMP slurry. Because the inhibiting film persists at higher temperatures, the interval of time between removal of the inhibiting film and deposition of the passivation layer may be reduced, thus reducing the time the surface of the metal feature remains unprotected against oxide formation. Examples of such inhibiting materials include O—Cu—$N(R)_x$ and $(R)_xN$—Cu—$N(R)_x$.

In yet another preferred embodiment, a conventional silicon nitride passivation layer is used. However, the silicon nitride passivation layer is deposited at lower deposition temperatures than are conventionally used for a silicon nitride passivation layer. By utilizing reduced silicon nitride passivation layer deposition temperatures, the inhibiting film may be removed a shorter time interval before reaching the silicon nitride passivation layer deposition temperature. Thus, oxide formation on the surface of the metallization features during a passivation layer deposition process may be advantageously reduced by reducing the time the surface of the metal feature remains unprotected against oxide formation.

Thus, the formation of oxides on the surface of the metallization features during the passivation layer deposition process is substantially reduced and the above-mentioned problems associated with oxide (particularly Cu oxide) formation on the metallization features and the resulting weak bond formed between the metallization features and the passivation layer are avoided. Electromigration of the metal in the metallization features may, therefore, be advantageously minimized or substantially prevented.

One preferred embodiment of the present invention will now be described with reference to FIGS. 2A, 2B and 2C, which show, in simplified, cross-sectional, schematic fashion, an illustrative, but not limiting, embodiment of the present invention comprising a process performed on a semiconductor wafer substrate-based workpiece produced according to the process illustrated in FIGS. 1A through 1D, wherein similar reference numerals are used throughout to denote similar features. As will be apparent to one of ordinary skill in the art, the inventive methodology is readily adapted for use in the manufacture of a variety of electrical and electronic devices utilizing inlaid metallization patterns, e.g., printed circuit boards and integrated circuit devices. It should also be recognized that the processes and structures described below do not necessarily form a complete process flow for manufacturing such devices. However, the present invention can be used in conjunction with conventional technology currently employed in the art, e.g., integrated circuit fabrication methodology, and, consequently, only so much of the commonly practiced processes are included here as are necessary for an understanding of the present invention. As employed throughout the disclosure and claims, the term "substrate" and/or "semiconductor wafer substrate" includes, e.g., a semiconductor substrate per se or an epitaxial layer formed on a suitable semiconductor substrate. Finally, the drawing figures representing crosssections of portions of a semiconductor device during fabrication processing are not drawn to scale, but instead are drawn as to best illustrate the features of the present invention.

Figure 2A:
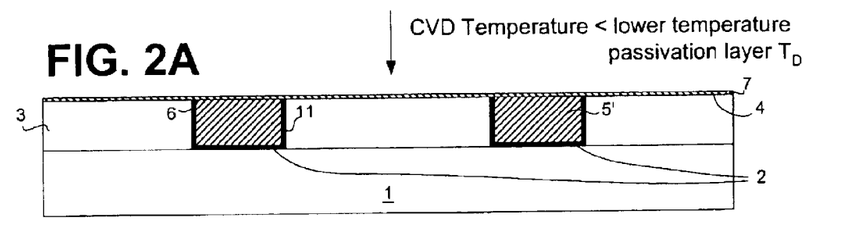
FIGS. 2A, 2B and 2C illustrate, in simplified, cross-sectional schematic form, a process for reducing oxide formation on a metal feature by forming a passivation layer comprising a material that is formed on the surface of the metal feature at a lower temperature than silicon nitride, according to a preferred embodiment of the invention.

Referring now to FIG. 2A, according to a preferred embodiment of the present invention, a semiconductor substrate-based workpiece similar to that shown in FIG. 1D is provided, having a desired inlaid metallization pattern, comprising a semiconductor wafer substrate 1, a dielectric layer 3 overlying substrate 1 and having recesses formed in the exposed, upper surface 4 thereof, and metal portions 5' of an unalloyed metal, illustratively Cu, filling the recesses 2, the exposed, upper surfaces 6 of the metal portions 5' being substantially co-planar with the exposed, upper surface 4 of the dielectric layer 3. Interposed between the sidewalls and bottom surface of the recesses and metal portions 5' is a diffusion barrier layer 11 for preventing diffusion of atoms and/or ions of the metal portions 5' into the dielectric layer 3 and/or semiconductor wafer substrate 1.

In the illustrated structures, semiconductor substrate 1 typically comprises a wafer of monocrystalline Si or GaAs, layer 3 comprises an insulative material typically utilized as an inter-layer dielectric (ILD), i.e., an inorganic material such as a silicon oxide, nitride, or oxynitride, or an organic-based or derived material, such as parylene, benzocyclobutene (BCB), etc. Suitable materials for barrier layer 11 include, e.g., Ti, W, Cr, Ta, and TaN.

Recesses 2 formed in the upper, exposed surface 4 of dielectric layer 3 are utilized for forming vias, inter-level metallization, and/or interconnection routing of at least one active device region or component formed on or within semiconductor wafer substrate 1 and typically include high aspect (i.e., depth-to-width) ratios greater than one, sub-micron or micron-sized dimensions, and sub-micron or micron-sized dimensions, i.e., widths of from about 0.08 to about 3.0 $\mu$m and depths of from about 0.4 to about 2.0 $\mu$m.

FIG. 2A shows the device of FIG. 1D at the beginning of a CVD process for depositing a low temperature passivation layer over the device, according to a preferred embodiment of the present invention. In the present preferred embodiment, the material for the low temperature passivation layer is chosen such that the deposition temperature for the low temperature passivation layer is lower than the conventional deposition temperature for a silicon nitride passivation layer and such that the deposition temperature for the passivation layer is reached a shorter time interval after the inhibiting film has been removed from the surface of the device than in the conventional damascene-type methodology. As an example, materials that may be used for the low temperature passivation layer include silicon carbide and SiCN. These materials may be deposited at temperatures ranging from about 250 to 350 degrees C.

As the temperature in the deposition chamber increases towards the $T_D$ for the low temperature passivation layer, the inhibiting film 7 is maintained, as shown in FIG. 2A. Thus, the surfaces of the metal portions 5' remain protected against formation of oxides as the temperature in the deposition chamber continues to increase towards the $T_D$ for the low temperature passivation layer.

Figure 2B:
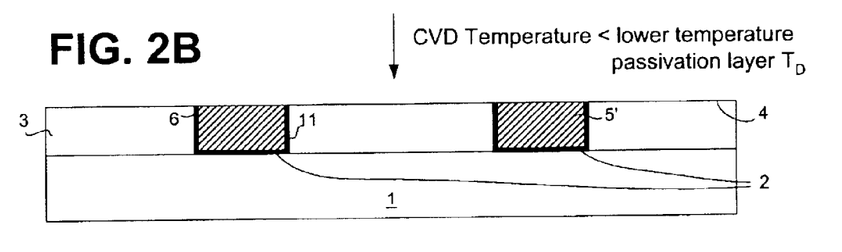

Referring now to FIG. 2B, as the temperature in the deposition chamber continues to increase and approaches $T_D$ for the low temperature passivation layer, the inhibiting film 7 is removed from the surface of the device, as shown in FIG. 2B. The removal of the inhibiting film 7 occurs a shorter time interval before the passivation layer deposition temperature is reached than in the conventional damascene-type methodology. Thus, the surfaces of the metal portions 5' remain protected against formation of oxides by the inhibiting film for a longer time interval as the temperature in the deposition chamber continues to increase towards the $T_D$ for the low temperature passivation layer.

Figure 2C:
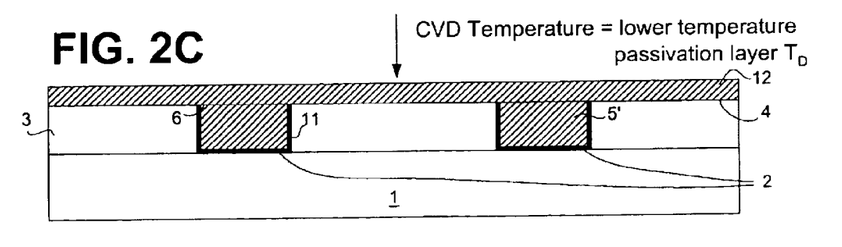

Referring now to FIG. 2C, when $T_D$ is reached, the low temperature passivation layer 12 may be deposited over the upper, exposed surface 4 of dielectric layer 3 and the exposed, upper surfaces 6 of the metal portions 5'. The passivation layer reduces diffusion of atoms and/or ions from metal portions 5' along oxide layers and thus the electromigration life-time of the metal portions 5' may be maintained.

Another preferred embodiment of the present invention will now be described with reference to FIGS. 3A, 3B and 3C, which show, in simplified, cross-sectional, schematic fashion, an illustrative, but not limiting, embodiment of the present invention comprising a process performed on a semiconductor wafer substrate-based workpiece produced according to the process illustrated in FIGS. 1A through 1D, wherein similar reference numerals are used throughout to denote similar features.

Figure 3A:
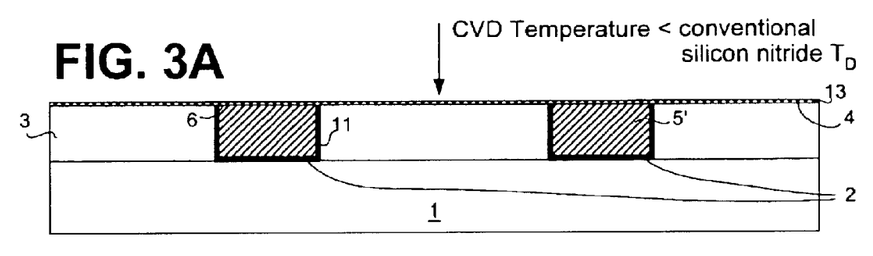
FIGS. 3A, 3B and 3C illustrate, in simplified, cross-sectional schematic form, a process for reducing oxide formation on a metal feature employing a silicon nitride passivation layer and utilizing an inhibiting film comprising a material that is removed at higher temperatures, according to a preferred embodiment of the invention.

FIG. 3A shows the device of FIG. 1D at the beginning of a CVD process for depositing a silicon nitride passivation layer over the device, according to a preferred embodiment of the present invention. However, in contrast to the device shown in FIG. 1D, according to the present preferred embodiment, replacing inhibiting film 7 is inhibiting film 13, which comprises a material chosen such that inhibiting film 13 persists on the surface of the device at higher temperatures and thus for a longer time interval before reaching the conventional silicon nitride passivation layer deposition temperature.

Thus, because the inhibiting film 13 is maintained on the surface of the device for a longer time interval before the conventional silicon nitride passivation layer deposition temperature is reached, the inhibiting film 13 protects against formation of oxides as the temperature in the deposition chamber increases towards the conventional $T_D$ for silicon nitride. Materials for the inhibiting film 13 may include O—Cu—N(R)$_x$ and (R)$_x$N—Cu—N(R)$_x$.

As the temperature in the deposition chamber increases towards the conventional $T_D$ for the silicon nitride passivation layer, the inhibiting film 13 is maintained, as shown in FIG. 3A. Thus, the surfaces of the metal portions 5' remain protected against formation of oxides as the temperature in the deposition chamber continues to increase towards the conventional $T_D$ for the silicon nitride passivation layer.

Figure 3B:
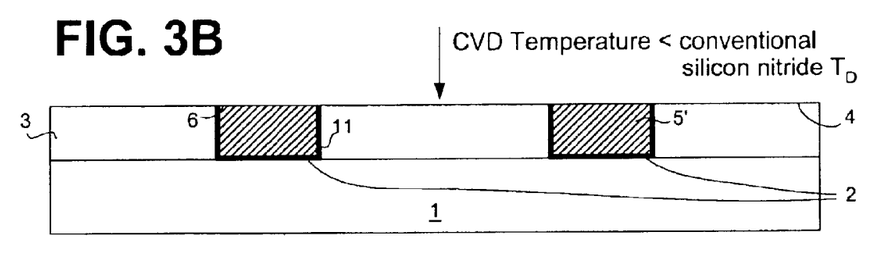

As the temperature in the deposition chamber continues to increase and approaches the conventional $T_D$ for the passivation layer, the inhibiting film 13 is removed from the surface of the device, as shown in FIG. 3B. In the present embodiment, the removal of the inhibiting film 13 occurs a shorter time interval before the conventional silicon nitride passivation layer deposition temperature is reached than in the case where a conventional inhibiting film is used. Thus, the surfaces of the metal portions 5' remain protected against formation of oxides as the temperature in the deposition chamber continues to increase towards the conventional $T_D$ for the silicon nitride passivation layer.

Figure 3C:
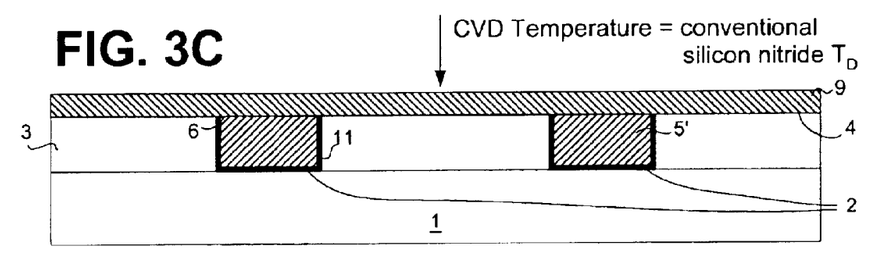

Referring now to FIG. 3C, when the conventional $T_D$ for the silicon nitride passivation layer is reached, the passivation layer 9 may be deposited over the upper, exposed surface 4 of dielectric layer 3 and the exposed, upper surfaces 6 of the metal portions 5'. This reduces diffusion of atoms and/or ions from metal portions 5' along oxide layers and thus the electromigration life-time of the metal portions 5' may be maintained.

Another preferred embodiment of the present invention will now be described with reference to FIGS. 4A, 4B and 4C, which show, in simplified, cross-sectional, schematic fashion, an illustrative, but not limiting, embodiment of the present invention comprising a process performed on a semiconductor wafer substrate-based workpiece produced according to the process illustrated in FIGS. 1A through 1D, wherein similar reference numerals are used throughout to denote similar features.

Figure 4A:
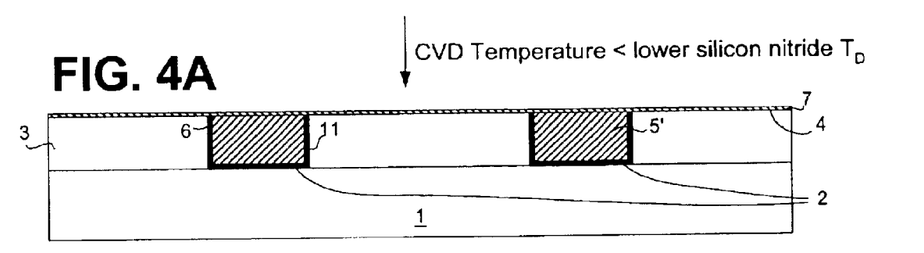
FIGS. 4A, 4B and 4C illustrate, in simplified, cross-sectional schematic form, a process for reducing oxide formation on a metal feature employing a silicon nitride passivation layer and forming the silicon nitride passivation layer on the surface of the metal feature at a lower temperature than conventionally used for silicon nitride passivation layer formation, according to a preferred embodiment of the invention.

FIG. 4A shows the device of FIG. 1D at the beginning of a CVD process for depositing a silicon nitride passivation layer over the device, according to a preferred embodiment of the present invention. However, according to the present embodiment, lower silicon nitride passivation layer deposition temperatures are used than in the conventional damascene-type methodology. These lower temperatures may have a range of approximately less than 400 degrees C. Other alternative passivation layer materials such as silicon carbide and SiCN may also be formed at these temperatures.

As the temperature in the deposition chamber increases towards the lower $T_D$ for the silicon nitride passivation layer, the inhibiting film 7 is maintained, as shown in FIG. 4A. Thus, the surfaces of the metal portions 5' remain protected against formation of oxides as the temperature in the deposition chamber continues to increase towards the lower $T_D$ for the silicon nitride passivation layer.

Figure 4B:
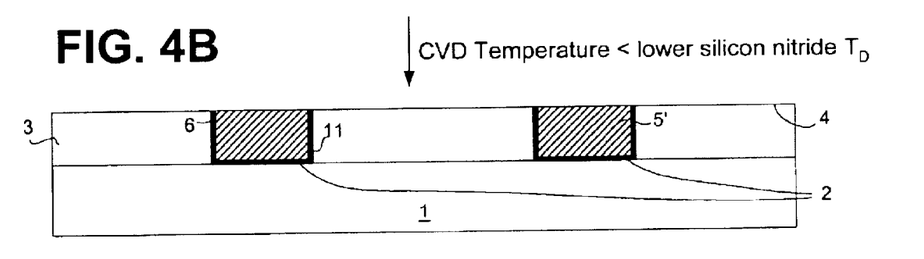

As the temperature in the deposition chamber continues to increase and approaches the lower $T_D$ for the silicon nitride passivation layer, the inhibiting film 7 is removed from the surface of the device, as shown in FIG. 4B. In the present embodiment, the removal of the inhibiting film 7 occurs a shorter time interval before the lower silicon nitride passivation layer deposition temperature is reached than in the case where conventional silicon nitride passivation layer deposition temperatures are used. Thus, the surfaces of the metal portions 5' remain protected against formation of oxides as the temperature in the deposition chamber continues to increase towards the lower $T_D$ for the silicon nitride passivation layer.

Figure 4C:
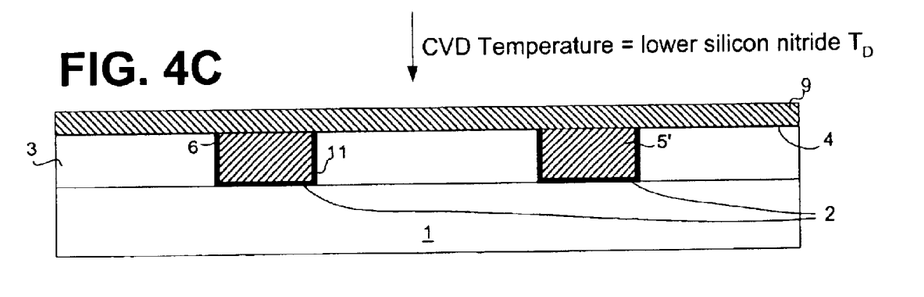

Referring now to FIG. 4C, when the lower $T_D$ for the silicon nitride passivation layer is reached, the passivation layer 9 may be deposited over the upper, exposed surface 4 of dielectric layer 3 and the exposed, upper surfaces 6 of the metal portions 5'. This reduces diffusion of atoms and/or ions from metal portions 5' along oxide layers and thus the electromigration life-time of the metal portions 5' may be maintained.

Figure 5:
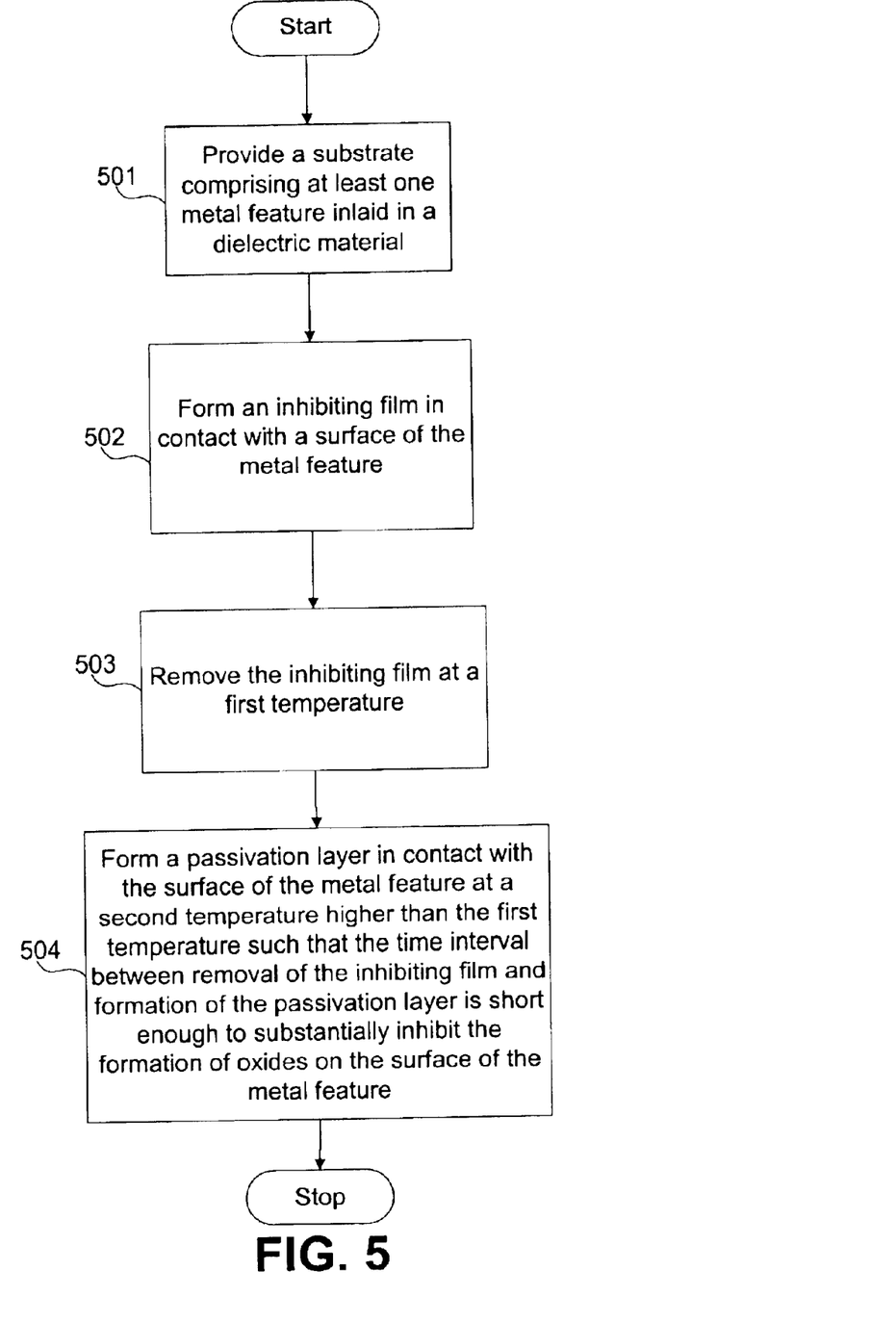
FIG. 5 shows a process flow diagram illustrating an embodiment of the present invention.

FIG. 5 shows a process flow diagram illustrating an embodiment of the present invention. The process flow diagram encompasses the preferred embodiment of the present invention, as well as other alternative embodiments. Initially, at 501, a substrate comprising at least one metal feature inlaid in a dielectric material is provided. Next, at 502, an inhibiting film in contact with a surface of the metal feature is formed. Then, at 503, the inhibiting film is removed at a first temperature. Then, at 504, a passivation layer is formed in contact with the surface of the metal feature at a second temperature higher than the first temperature such that the time interval between removal of the inhibiting film and formation of the passivation layer is short enough to substantially inhibit the formation of oxides on the surface of the metal feature. In accordance with preferred embodiments, the inhibiting film substantially inhibits oxide formation on the at least one metal feature at temperatures below the first temperature.

During the conventional process for depositing a passivation layer, as shown in FIGS. 1E through 1H, oxide layers may form on the upper surfaces 6 of the metal portions 5' of the device. The oxide layer(s) may result in poor adhesion of the passivation layer. The oxide layers may also provide a path for electromigration of atoms and/or ions from the metallization features along the oxide layers.

The present invention advantageously maintains an inhibiting film deposited over the metallization features (for example, in a CMP process) during a subsequent passivation layer deposition process. The inhibiting film substantially inhibits formation of an oxide layer on the surface of the metallization features while the temperature within a deposition chamber approaches $T_D$. The reduction in oxide layer formation advantageously results in improved adhesion characteristics, decreased contact resistance, and more reliable vias, interlevel metallization, and/or interconnection lines. In addition, electromigration of atoms and/or ions of the conductive metal along the oxide layer is inhibited or substantially prevented, thus increasing the overall reliability of the electrical device.

The present invention thus provides a simple, convenient, and reliable method for reducing, or substantially preventing, deleterious electromigration of metal from inlaid metallization features along an oxide layer by maintaining an inhibiting film which substantially inhibits formation of an oxide layer on the surface of the metallization features while the temperature within a deposition chamber approaches $T_D$. The present invention enables the formation of extremely reliable interconnect members and patterns, illustratively, but not limited to, Cu, by providing a method for reliably reducing, or substantially preventing, deleterious electromigration.

The inventive methodology enjoys particular utility in the manufacture of semiconductor devices having sub-micron dimensioned metallization features and high aspect ratio openings. Moreover, the inventive methodology can be practiced according to requirements for economic competitiveness, and is fully compatible with conventional process flow for automated manufacture of high-density integration semiconductor devices. In addition, the invention is particularly well suited to the manufacture of circuit boards and other types of electrical and electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of passivating a metal feature wherein formation of a passivation layer is temperature dependent, the method comprising:

forming an inhibiting film in contact with a surface of the metal feature;

removing the inhibiting film at a first temperature during a passivation layer formation process; and forming a passivation layer in contact with the surface of the metal feature at a second temperature higher than the first temperature, such that the time interval between removal of the inhibiting film and formation of the passivation layer is short enough to substantially inhibit the formation of oxides on the surface of the metal feature;

wherein the inhibiting film inhibits oxide formation on the surface of the metal feature at temperatures below the first temperature.

2. The method recited in claim 1, wherein the inhibiting film is fromed from precursors selected from the group consisting of benzotriazole (BTA), tolyltriazole (TTA), BTA carboxylic acids (BTA-COOH), cystine, haloacetic acids, glucose, dodecyl mercaptan, 1,2,4-triazole, imidazole, benzimidazole, and tetrazole.

3. The method recited in claim 1, wherein the second temperature is less than approximately 400 degrees Celsius (C.).

4. The method recited in claim 3, wherein the passivation layer is selected from the group consisting of silicon carbide (SiC) and SiCN.

5. The method recited in claim 1, wherein the second temperature is approximately 400 degrees Celsius (C.) and wherein the inhibiting film comprises a material that is removed upon reaching a first temperature at a time interval before reaching the second temperature that is short enough to substantially inhibit the formation of oxides on the surface of the metal feature.

6. The method recited in claim 5, wherein the inhibiting film comprises a material selected from the group consisting of O—Cu—N(R)$_x$ or (R)$_x$N—Cu—N(R)$_x$.

7. The method recited in claim 1, wherein the inhibiting film is formed during a chemical-mechanical polish (CMP) process utilizing a slurry comprising a material used as the inhibiting film.

8. The method recited in claim 1, wherein the passivation layer is formed in accordance with a chemical vapor deposition (CVD) process.

9. The method recited in claim 1, wherein the metal feature comprises at least one of a via, an interlevel metallization, and an interconnection line.

10. The method recited in claim 1, wherein the metal feature comprises copper (Cu).

11. A method of passivating metallization features on an electrical device, the method comprising:

providing a substrate comprising at least one metal feature inlaid in a dielectric material;

forming an inhibiting film in contact with a surface of the metal feature;

removing the inhibiting film at a first temperature; and forming a passivation layer in contact with the surface of the metal feature at a second temperature higher than the first temperature such that the time interval between removal of the inhibiting film and formation of the passivation layer is short enough to substantially inhibit the formation of oxides on the surface of the metal feature;

wherein the inhibiting film inhibits oxide formation on the surface of the metal feature at temperatures below the first temperature.

12. The method recited in claim 11, wherein the inhibiting film is selected from the group consisting of benzotriazole (BTA), tolyltriazole (TTA), BTA carboxylic acids (BTA-COOH), cystine, haloacetic acids, glucose, dodecyl mercaptan, 1,2,4-triazole, imidazole, benzimidazole, and tetrazole.

13. The method recited in claim 11, wherein the second temperature is less than approximately 400 degrees Celsius (C.).

14. The method recited in claim 13, wherein the passivation layer is selected from the group consisting of silicon carbide (SiC) and SiCN.

15. The method recited in claim 11, wherein the second temperature is approximately 400 degrees Celsius (C.) and wherein the inhibiting film comprises a material that is removed upon reaching a first temperature a time interval before reaching the second temperature short enough to substantially inhibit the formation of oxides on the surface of the metal feature.

16. The method recited in claim 15, wherein the inhibiting film comprises a material selected from the group consisting of O—Cu—N(R)$_x$ or (R)$_x$N—Cu—N(R)$_x$.

17. The method recited in claim 11, wherein the inhibiting film is formed during a chemical-mechanical polish (CMP) process utilizing a slurry comprising a material used as the inhibiting film.

18. The method recited in claim 11, wherein the passivation layer is formed in accordance with a chemical vapor deposition (CVD) process.

19. The method recited in claim 11, wherein the electrical device comprises a semiconductor integrated circuit device; and wherein the substrate comprises one of monocrystalline silicon (Si) and gallium arsenide (GaAs), and the metal feature comprises at least one of a via, an interlevel metallization, and an interconnection line.

20. The method recited in claim 11, wherein the metal feature comprises copper (Cu).

* * * * *